United States Patent
Liu et al.

(10) Patent No.: US 7,608,308 B2
(45) Date of Patent: Oct. 27, 2009

(54) P-TYPE SEMICONDUCTOR ZINC OXIDE FILMS PROCESS FOR PREPARATION THEREOF, AND PULSED LASER DEPOSITION METHOD USING TRANSPARENT SUBSTRATES

(75) Inventors: Bing Liu, Ann Arbor, MI (US); Zhendong Hu, Ann Arbor, MI (US); Yong Che, Ann Arbor, MI (US); Yuzuru Uehara, Ann Arbor, MI (US)

(73) Assignee: Imra America, Inc., Ann Arbor, MI (US)

( * ) Notice: Subject to any disclaimer, the term of this patent is extended or adjusted under 35 U.S.C. 154(b) by 585 days.

(21) Appl. No.: 11/405,020

(22) Filed: Apr. 17, 2006

(65) Prior Publication Data

US 2007/0243328 A1   Oct. 18, 2007

(51) Int. Cl.
- C23C 14/30 (2006.01)
- H05B 7/00 (2006.01)
- C23C 8/00 (2006.01)

(52) U.S. Cl. .................. 427/596; 427/586
(58) Field of Classification Search .......... 427/596, 427/554, 572, 586
See application file for complete search history.

(56) References Cited

U.S. PATENT DOCUMENTS

| | | | |
|---|---|---|---|
| 4,895,735 | A | 1/1990 | Cook |
| 5,173,441 | A | 12/1992 | Yu et al. |
| 6,159,832 | A | 12/2000 | Mayer |
| 6,610,141 | B2 | 8/2003 | White et al. |
| 6,624,441 | B2 | 9/2003 | Cantwell et al. |

(Continued)

FOREIGN PATENT DOCUMENTS

CN   200510018221   9/2005

(Continued)

OTHER PUBLICATIONS

Pulsed Laser Deposition of Thin Films, Douglas Chrisey, 1994, John Wiley & Sons, Inc.

(Continued)

*Primary Examiner*—Roberts Culbert
(74) *Attorney, Agent, or Firm*—Sughrue Mion, PLLC (57) ABSTRACT

A p-type semiconductor zinc oxide (ZnO) film and a process for preparing the film are disclosed. The film is co-doped with phosphorous (P) and lithium (Li). A pulsed laser deposition scheme is described for use in growing the film. Further described is a process of pulsed laser deposition using transparent substrates which includes a pulsed laser source, a substrate that is transparent at the wavelength of the pulsed laser, and a multi-target system. The optical path of the pulsed laser is arranged in such a way that the pulsed laser is incident from the back of the substrate, passes through the substrate, and then focuses on the target. By translating the substrate towards the target, this geometric arrangement enables deposition of small features utilizing the root of the ablation plume, which can exist in a one-dimensional transition stage along the target surface normal, before the angular width of the plume is broadened by three-dimensional adiabatic expansion. This can provide small deposition feature sizes, which can be similar in size to the laser focal spot, and provides a novel method for direct deposition of patterned materials.

10 Claims, 9 Drawing Sheets

U.S. PATENT DOCUMENTS

| | | | |
|---|---|---|---|
| 6,766,764 | B1 | 7/2004 | Chrisey et al. |
| 6,908,782 | B2 | 6/2005 | Yan et al. |
| 2003/0039765 | A1* | 2/2003 | Hayakawa et al. .......... 427/554 |
| 2005/0170971 | A1 | 8/2005 | Yata et al. |

FOREIGN PATENT DOCUMENTS

| | | |
|---|---|---|
| WO | WO 00/22202 | 4/2000 |
| WO | WO 2005076341 | 8/2005 |

OTHER PUBLICATIONS

D. Linde, et al., *Laser-solid interaction in the femtosecond time regime*, Applied Surface Science, vol. 109-110, 1, 1997.

E.G. Gamaly and A.V. Rode, *Electrostatic mechanism of ablation by femtosecond lasers*, Applied Surface Science, vol. 197-198, 699, 2002.

Z. Zhang, et al., *Multi-diagnostic comparison of femtosecond and nanosecond pulsed laser plasmas*, Journal of Applied Physics, vol. 92 (5), 2867, 2002.

K. Nakahara et al., *Growth of N-doped and Ga+N-codoped ZnO films by radical source molecular beam epitaxy*, Journal of Crystal Growth, vol. 237-239, 503, 2002.

M. Sumiya et al., *SIMS analysis of ZnO films co-doped with N and Ga by temperature gradient pulsed laser deposition*, Applied Surface Science, vol. 223, 206, 2004.

E. C. Lee et al., *Compensation mechanism for N acceptors in ZnO*, Phys. Rev. B vol. 64, 085120, 2001.

H. Matsui, et al., *N doping using $N_2O$ and NO sources: From the viewpoint of ZnO*, J. Appl. Phys. vol. 95, 5882, 2004.

P.K. Wu et al, *Laser Transfer of Biomaterials : Matrix-assisted pulsed laser evaporation (MAPLE) and MAPLE Direct Write* ; vol. 74, No. 4, Apr. 2003, pp. 2546-2557.

K. K. Kim, et al., *Realization of p-type ZnO thin films via phosphorus doping and thermal activation of the dopant*, Appl. Phys. Lett. vol. 83, 63, 2003.

Y. R. Ryu, et al., *Properties of arsenic-doped p-type ZnO grown by hybrid beam deposition*, Appl. Phys. Lett. 83, 87, 2003.

D.C. Look et al., *As-doped p-type ZnO produced by an evaporation/ sputtering process*, Appl. Phys. Lett. 85, 5269, 2004.

P. R. Willmott and J. R. Huber, Pulsed Laser Vaporization and Deposition, Review of Modern Physics, vol. 72 (2000), pp. 315-327.

J. Shen, Zhen Gai, and J. Kirschner, Growth and Magnetism of Metallic Thim Films and Multilayers by Pulsed Laser Deposition, Surface Science Reports, vol. 52 (2004), pp. 163-218.

D. B. Chrisey and G. K. Hubler, Pulsed Laser Deposition of Thin Films, John Wiley & Sons, Inc., New York, 1994.

J. Bohandy, B. F. Kim, and F. J. Adrian, Metal Deposition from a Supported Metal Film Using an Excimer Lser, Journal of Applied Physics, vol. 60 (1986), pp. 1538-1539.

R. Teghil et al., Picosecond and Femtosecond Pulsed Laser Ablation and Deposition of Quasiparticles, Applied Surface Science, vol. 210 (2003), pp. 307-317.

J. Perriere et al., Comparison Between ZnO Films Grown by Femtosecond and Nanosecond Laser Ablation, Journal of Applied Physics, vol. 91 (2002), pp. 690-696.

J. C. S. Kools, E. van de Riet, and J. Dieleman, A Simple Formalism for the Prediction of Angular Distributions in Laser Ablation Deposition, Applied Surface Science, vol. 69 (1993), pp. 133-139.

D. Sibold and H. M. Urbassek, Kinetic Study of Pulsed Desorption Flows into Vacuum, Physical Review A, vol. 43 (1991), pp. 6722-6734.

R. Gilgenbach and P. L. G. Ventzek, Dynamics of Excimer Laser-Ablated Aluminum Neutral Atom Plume Measured by Dye Laser Resonance Absorption Photography, Applied Physics Letters, vol. 58 (1991), pp. 1597-1599.

H-J. Ko, et al., Doping of acceptor impurities into ZnO, IEEE Conference on Molecular Beam Epitaxy, 2002, pp. 327-328.

D.C. Look, et al., P-type doping and devices based on ZnO, Phys. Stat. Sol., Mar. 2004, pp. 624-630, vol. 241, No. 3.

Y.W. Heo, et al., Shallow donor formation in phosphorus-doped ZnO thin films, Applied Physics A, 2004, pp. 53-57, vol. 78.

\* cited by examiner

FIG. 1

FIG.2 (a) XRD θ-2θ patterns. (b) Pole figure, where ZnO <10-11> poles are shown as the six small dots and sapphire <11-23> poles are the three big dots.

FIG. 3 SEM image

FIG. 4 Transmission Spectrum

FIG. 5 SIMS profile

P-TYPE SEMICONDUCTOR ZINC OXIDE FILMS PROCESS FOR PREPARATION THEREOF, AND PULSED LASER DEPOSITION METHOD USING TRANSPARENT SUBSTRATES

BACKGROUND

1. Field of the Invention

This invention relates to the fabrication of semiconductor ZnO (zinc oxide) for application in electric and optoelectric devices. Particularly, this invention provides a simple and reproducible process to dope ZnO to make this material have a p-type conductivity. This invention is also related to the process of pulsed laser deposition of transparent thin films, particularly to the deposition of large area transparent thin films and multilayer periodic dielectric structures on transparent substrates.

2. Description of the Related Art

ZnO is a semiconductor material with a large direct bandgap of 3.37 eV at room temperature. Due to this large bandgap and a large exciton binding energy (60 meV), ZnO has great potential for use in short-wavelength optoelectronic devices, such as light-emitting diodes (LEDs), laser diodes (LDs), and ultraviolet light detectors. In the past years, this field has been dominated by other materials such as GaN and SiC, which are very expensive to fabricate. In comparison, the cost of making ZnO is very low. For this reason, ZnO has also been considered for large scale applications such as solid-state lighting, transparent electronics, flat-panel displays, and solar cells. However, ZnO is intrinsically n-type, and the unavailability of a reliable process to fabricate robust p-type ZnO is the bottleneck in the commercialization of ZnO-based devices.

Previously, nitrogen (N) doping has been the most widely used method to produce p-type ZnO. However, use of this method involves a compromise between nitrogen solubility and film structural quality. This is because high structural quality requires high growth temperatures, whereas the nitrogen solubility decreases with growth temperature. WIPO publication WO0022202 provides a Ga and N co-doping approach to achieve p-type conductivity in ZnO with a high N concentration at the substitutional sites for oxygen (and therefore a high hole concentration). However, the results of a few other attempts (K. Nakahara et al., Journal of Crystal Growth, Vol. 237-239, 503, 2002; M. Sumiya et al., Applied Surface Science, Vol. 223, 206, 2004) using this co-doping method are inconsistent and irreproducible. More recently, a process called 'temperature-modulated growth' was disclosed in WIPO publication WO05076341. This method deals with the mutual exclusivity between N solubility and film structural quality by periodically fast ramping the growth temperature, which, in practice, is a very complicated process discloses a method of fabricating p-type ZnO film by co-doping N with alkali metal elements. It is believed that the co-doping with the alkali metal atoms leads to the compensation of donor defects in ZnO film and eventually enhances the p-type conductivity.

In the above N doping approaches, either gas sources, such as NO and $NO_2$ (U.S. Pat. No. 6,908,782) or plasma sources that discharge $N_2$, $N_2O$, NO or $NO_2$ gases are employed. However, using nitrogen oxide (NOx) gasses inevitably results in negative environmental impacts. In addition, there are technical shortcomings in N doping, which are addressed in, e.g., E. C. Lee et al., Phys. Rev. B Vol. 64, 085120, 2001; and H. Matsui, et al., J. Appl. Phys. Vol. 95, 5882, 2004. For example, nitrogen-related donor defects can be generated in the doping process due to the competition between electron-impact and gas-phase reactions, which often occur within the plasma source and during the growth.

In addition to nitrogen, other group-V elements, such as phosphorus (P) and arsenic (As) have also been used as alternative dopants (K. K. Kim, et al., Appl. Phys. Lett. 83, 63, 2003; Y. R. Ryu, et al., Appl. Phys. Lett. 83, 87, 2003; D.C. Look et al., Appl. Phys. Lett. 85, 5269, 2004; U.S. Pat. No. 6,610,141). However the reported results have not been widely confirmed.

The invention uses pulsed laser deposition to grow the ZnO films and films of other materials. Pulsed laser deposition (PLD) is a powerful tool for growth of complex compound thin films. In conventional nanosecond PLD, a beam of pulsed laser light with a typical pulse duration of a few nanoseconds is focused on a solid target. Due to the high peak power density of the pulsed laser, the irradiated material is quickly heated to above its melting point, and the evaporated materials are ejected from the target surface into a vacuum in a form of plasma (also called a plume). For a compound target, the plume contains highly energetic and excited ions and neutral radicals of both the cations and the anions with a stoichiometric ratio similar to that of the target. This provides one of the most unique advantages of PLD over the conventional thin film growth techniques such as chemical vapor deposition (CVD) and molecular beam epitaxy (MBE). The characteristics of this growth method have been reviewed in several recent journal articles and are summarized in the book by Chrisey and Hubler. See, e.g., P. R. Willmott and J. R. Huber, Pulsed Laser Vaporization and Deposition, Review of Modern Physics, Vol. 72 (2000), pp 315-327; J. Shen, Zhen Gai, and J. Kirschner, Growth and Magnetism of Metallic Thin Films and Multilayers by Pulsed Laser Deposition, Surface Science Reports, Vol. 52 (2004), pp 163-218; and D. B. Chrisey and G. K. Hubler, Pulsed Laser Deposition of Thin Films, John Wiley & Sons, Inc., New York, 1994.

With the appearance of commercially available ultra-fast pulsed lasers (with typical pulse durations of a few picoseconds down to tens of femtoseconds), ultra-fast PLD has attracted much attention. First, due to the extremely short pulse duration and the resultant high peak power density, multiphoton excitation of free carriers becomes significant in transparent materials, and the critical fluence of ablation can be reduced by 1-2 orders of magnitude compared with conventional nanosecond laser ablation. As a result, the commonly favored ultraviolet wavelength in nanosecond laser ablation is no longer a requirement in ultra-fast PLD. In fact, focused ultra-fast pulsed infrared lasers have been successfully used to ablate wide band gap materials. Second, when the laser pulse duration is shorter than the time scale of carrier-phonon interaction (typically a few picoseconds), heat diffusion in the target is negligible. For this reason, ultra-fast PLD has been considered as a good solution to the problem of droplet generation that has long been hindering wider application of PLD. Another advantageous result of the limited heat diffusion is that the removal of target materials is confined to the area within the laser focal spot. This mechanism has enabled the precise laser machining with submicron resolution using ultra-fast lasers.

With the advantages of PLD, especially those related to the ultra-fast PLD, in this invention, we also consider the application of PLD in the field of direct deposition of patterned structures. There have been several types of direct writing techniques involving application of pulsed lasers. (Here 'writing' means either adding materials onto substrates, i.e., deposition, or removing materials from substrates, i.e., etching.) For writing patterned materials by means of deposition, laser chemical vapor deposition (LCVD) utilizes laser-enhanced decomposition of CVD precursors for metals, and can be used for depositing metal lines and dots. Another technique is the laser-induced forward transfer (LIFT). See J. Bohandy, B. F. Kim, and F. J. Adrian, Metal Deposition from a Supported Metal Film Using an Excimer Laser, Journal of Applied Physics, Vol. 60 (1986), pp 1538-1539.

In LIFT, a metal thin film is first coated on one side of a transparent target substrate. A pulsed laser beam is incident from the other side (i.e., the uncoated side) of the target substrate and is focused on the front side (i.e., the coated side). The laser ablates the metal film and transports the metal vapor to the surface of a receiving substrate, which is positioned very close to the target substrate (10 μm or less). Various forms of LIFT have been proposed and are described in several U.S. patents cited or referenced by this application.

There are a few limitations in the application of the above two techniques. LCVD involves a complex CVD system and toxic metalorganic gases. In LIFT, the thin metal film limits the amount of material that can be deposited. Also, because the metal thin film is supported by a target substrate, ablation of the target substrate surface that is in direct contact with the film can be involved, which contaminates the deposited material. Finally, both techniques are suitable only for deposition of metals.

In order to transfer other types of material, there is known a variation of LIFT, matrix-assisted pulsed laser evaporation (MAPLE) and direct write, in which the material to be transferred is mixed with a matrix material which is volatile and easy to be ablated and pumped away. See P. K. Wu et al., Laser Transfer of Biomaterials: Matrix-Assisted Pulsed Laser Evaporation (MAPLE) and MAPLE Direct Write, Journal of Applied Physics, Vol. 74 (2003), pp 2546-2557. The mixture is then coated on the supporting target substrate as in the LIFT method. The MAPLE method is suitable for transferring biomaterials without destroying the biomolecules. For dielectrics, the deposits often remain in their original powder form, and adhesion and purity can be problematic due to the non-epitaxial nature and contamination by the matrix material, respectively.

Other laser-assisted direct depositing techniques include laser ink jet printing and Micropen© techniques. Both are wet techniques (i.e., involving liquid binders) and are not suitable for electronic and photonic applications. Therefore, for direct deposition of patterned high purity dielectric materials, in particular, by the way of growth (e.g., epitaxy), a suitable method is still lacking.

SUMMARY OF THE INVENTION

One object of this invention is to provide a simple and reproducible process to fabricate p-type ZnO film with high carrier concentration and high conductivity. This method uses two dopant elements to achieve this object.

According to theoretical predictions, both group-I and group-V elements are in principle possible candidates for p-type dopants in ZnO. On the other hand, ZnO is naturally an n-type material, which means that there is a large number of native donor defects to overcome in order to make it p-type. In practice, mono-doping ZnO with Li only results in semi-insulating ZnO, which is due to self-compensation of Li-related donor defects; and mono-doped ZnO with group-V elements is often unstable, mostly due to the low solubility of those elements and dopant-induced donor defects. In this invention, p-type ZnO is produced by doping the material simultaneously with both Li and P. Two possible reasons for the success of this co-doping method are that Li-related and other natural donor defects are possibly neutralized with co-doping of P and Li; and second, with Li substitution of Zn, P atoms tend to occupy more oxygen sites, which are desired for the formation of acceptors. Therefore, Li and P benefit each other in playing the role of acceptors.

The invention uses pulsed laser deposition (PLD) to grow the p-type ZnO material. In this method, a pulsed laser beam is focused onto a solid target of ZnO mixed with compounds containing both Li and P. Due to the high power density of the focused laser pulses, the material on the target surface is ablated and a plasma is formed, which in turn is deposited onto the substrate surface. Both the target and the substrate are installed in a high vacuum chamber with feedthroughs controlling their movements.

The most widely used pulsed laser source in PLD is the excimer laser, which has a pulse width of a few nanoseconds (ns) and a wave length in the UV region. Typical fluence (energy area density) is a few $J/cm^2$ for a typical focal spot of about 10 $mm^2$. One shortcoming of nanosecond laser PLD is generation of large droplets with sizes on the order of microns. This has impeded the wide application of nanosecond PLD in industrial production.

This invention uses a femtosecond or similar ultrashort pulse laser as the energy source for ablation. Compared with nanosecond laser pulses, femtosecond to picosecond laser pulses have much higher peak power due to their ultrashort pulse duration, and the ablation mechanism is also intrinsically different from that of nanosecond laser ablation. One fundamental difference is that within the femtosecond pulse duration, heat conduction in the target material is negligible, and therefore the ablation basically occurs in a non-melting regime. (D. Linde, et al, Applied Surface Science, 109/110, 1, 1997; E. G. Gamaly, et al, Applied Surface Science, 197-8, 699, 2002; Z. Zhang, et al, Journal of Applied Physics, 92-5, 2867, 2002). Consequently in femtosecond PLD, droplet free growth of thin films can be obtained.

To incorporate different dopant elements into the film, this invention uses a solid target made of ZnO powders mixed with different impurity compounds. Using such a mixed solid target largely simplifies the doping process in growth. For example, one can simply choose compounds that contain the desired dopant elements. And the dopant concentration can be controlled by varying the weight percentage of the impurity compound. In particular, one of the novel aspects of this invention regarding making the target is to mix ZnO powders with lithium phosphate ($Li_3PO_4$) powders which naturally contain both Li and P dopants. Compared with other methods of doping that use gas sources (for example precursors in CVD) and evaporation sources, this method is easy and cost-effective to perform, and generates negligible negative environmental effect.

Another object of the invention is to provide a method for pulsed laser deposition of transparent thin films and direct deposition of multilayer periodic structures on transparent substrates. The setup here includes a pulsed laser source, a substrate that is transparent to the wavelength of the pulsed laser, a continuous wave (CW) infrared laser for heating the substrate by irradiation, and a multi-target system. The pulsed laser is incident on the reverse side of the substrate and directed through the substrate and focused onto the target. The ablated material from the target is deposited on the substrate's front face which is facing the target. The distance between the substrate and the target is variable by translating the substrate towards or away from the target. When the substrate is away from the target, large area thin films can be grown. When the substrate is very close to the target, due to the small substrate-target distance and the narrow angular distribution of the ablation plume at its root, small features can be grown on the substrate with sizes similar to the laser focal spot. By laterally translating the substrate, patterned structures (e.g., periodic lines, grids, and dots) can be grown. Multilayer periodic dielectric structures can be grown by alternating the two growth processes at long or short substrate-target distances with different target materials, respectively.

Table 1 lists the electrical properties of P-Li-co-doped ZnO film obtained under different growth and post-growth treatment conditions.

Table 2 compares the electrical properties of an undoped and P-doped ZnO samples grown under similar conditions as those listed in Table 1.

DETAILED DESCRIPTION OF THE PRESENT INVENTION

Figure 1:
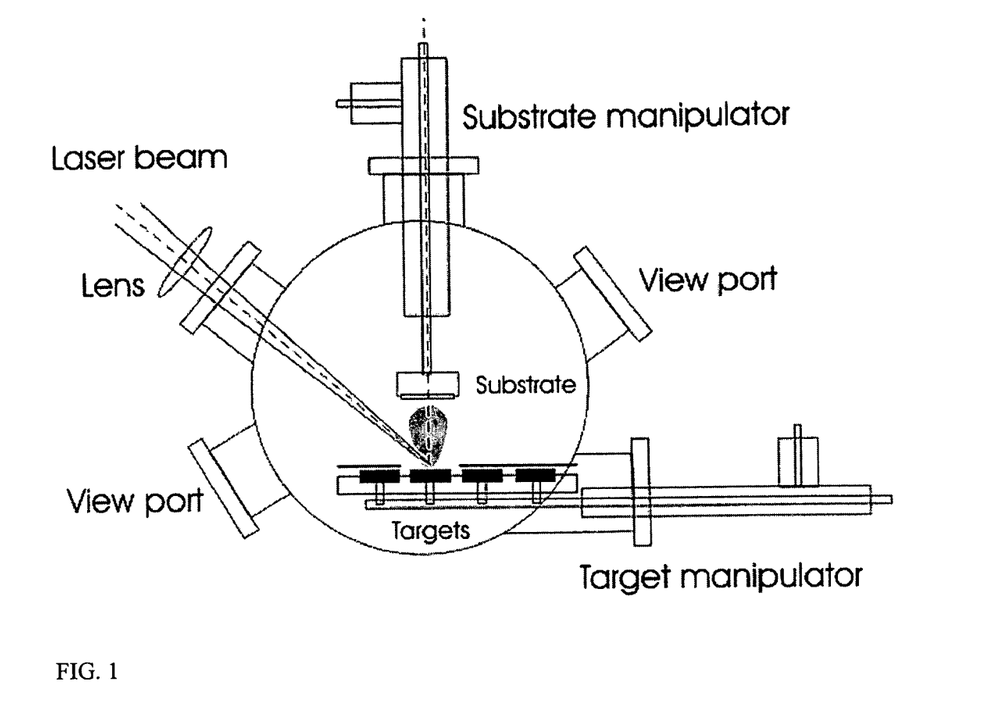
FIG. 1 is a schematic illustration of the pulsed laser deposition system for the fabrication of ZnO thin-films in the present invention.

The present invention first provides an economic and reliable method for fabricating p-type semiconductor ZnO films. The fabrication procedure includes making of the ablation target, vacuum laser ablation of the target and thin film deposition, and post-growth annealing. The setup of a femtosecond pulsed laser deposition (fs-PLD) system is schematically shown in FIG. 1.

The target for laser ablation is made of a mixture of ZnO powders with lithium phosphate ($Li_3PO_4$) powders of up to 2 wt %. Using lithium phosphate is an efficient way of simultaneous introduction of the two dopants. The mixed powders are first compressed with a hydraulic compressor with a pressure of 2-6 ton/$cm^2$. The solid target disk is then sintered for 10 hrs at temperatures up to 1000° C. During sintering, the target is buried in ZnO powders to avoid decomposition. The target thus made has a density of 90%. A high density (at least 80%) target is preferred for reducing particles in the ablation plume, which cause the deterioration of film quality, i.e. crystallinity and surface morphology, especially in the case of fs-PLD. Before introduction into the growth chamber, the target surface is also polished. The target manipulator provides lateral and rotational movements in the target surface plane. The target holder carousel has four stations to hold different targets so that multilayer films can be grown with different chemical compositions.

A femtosecond pulsed laser was used for the PLD process to fabricate the ZnO film. The laser beam has a pulse width in the range of 10 fs to 1 ps and a pulse energy in the range of 2 $\mu$J to 100 mJ. The beam is first expanded by 10 times by a telescope and then focused onto the target surface by a focusing lens. Under tight focus, the fluence (energy density) at the focal spot can be varied up to 250 J/$cm^2$ with a spot size of 400 $\mu m^2$. Due to the extremely high peak power (>$5 \times 10^6$ W) of the ultra-short pulse, the threshold of ablating ZnO using a femtosecond laser is relatively lower compared with that of nanosecond pulsed laser. A fluence above 1 J/$cm^2$ is sufficient to ablate the ZnO target and generate an ablation plasma. However, a high fluence up to 5 J/$cm^2$ is preferred to reduce the number of particles in the plasma plume.

Note that other pulsed lasers such as nanosecond or picosecond lasers can also be used in the PLD (pulsed laser deposition) process, and other high energy sources such as electron beam or ion/plasma can also be used for the purpose of evaporating or sputtering the solid targets. Therefore the preferred high energy source is a femtosecond to low picosecond pulsed laser for the reasons elaborated above, although the invention is not so limited.

The substrates are mounted on a substrate heater which can heat the substrates up to 900° C. The substrate manipulator provides for lateral and rotational movement to the substrate in its surface plane. The distance between the substrate and the target is also adjustable using the substrate manipulator.

The vacuum system is pumped by a turbo-molecular pump and operates at a base pressure of $1.5 \times 10^{-8}$ torr. The chamber can also be back-filled with different gases via gas inlets and outlets (not shown in FIG. 1) during growth. During the growth experiments of this invention, the chamber is filled with 0.1-20 millitorr oxygen.

Laser ablation occurs when the laser beam is focused on the target surface. During PLD growth, the laser focal spot is fixed while the disk-shaped target is rotated around its surface normal axis and laterally translated back and forth along its surface. This is equivalent to scanning the laser beam across the target surface. The angular velocity of the rotation is 1 rev/sec. The lateral translational movement speed is 0.3 mm/s. The fluence is 20 J/$cm^{-2}$. The pulse repetition rate is kept at 1 kHz. These parameters are all variable and the invention is not restricted to these values, although the given values have been found to be nominal for the growth described herein.

Before film deposition, the substrate is first outgassed by heating at temperatures up to 600° C. The substrate is then treated with an oxygen plasma for about 5 min to remove hydrocarbon contaminants. The target surface is usually pre-ablated for at least 20 min before film deposition. The purpose of pre-ablation is to clean the target surface, which is usually contaminated during fabrication. During the pre-ablation, a shutter is inserted between the target and the substrate to protect the substrate surface.

The growth is started by first depositing undoped ZnO for about 20 min at a low temperature of 300-400° C. The thickness of this low temperature layer is about 30 nm. For heteroepitaxy on sapphire, this early growth stage provides a buffer layer to absorb the strain due to the large lattice mismatch between ZnO and sapphire. After the buffer layer growth, the undoped ZnO target is moved away and the Li-P-co-doped ZnO target is moved into the ablation position and growth of the doped layer is started. The substrate temperature is also elevated to a higher range between 450-700° C. The higher growth temperature enhances atom surface mobility, which gives a better film crystallinity. The total thickness of the film is greater than 300 nm (up to 1 micron). After growth, the sample slowly cools down in an oxygen background of a few torr.

Post-growth treatment primarily includes annealing in a tube furnace under ambient conditions. Annealing temperature ranges between 500-1000° C., preferably between 600-800° C. Total time of annealing is typically in the range of 2-60 minutes. The annealing can also be performed in situ in the growth chamber after growth, provided that the growth chamber is backfilled with oxygen. However, ex situ annealing in a tube furnace is preferred because of the available high annealing temperature and fast heating and cooling rates.

The crystalline structures and electrical and optical properties of the films are examined by X-ray diffraction (XRD), Hall, and transmission measurements. The dopant depth profile is examined by secondary ion mass spectroscopy (SIMS).

Figure 2:
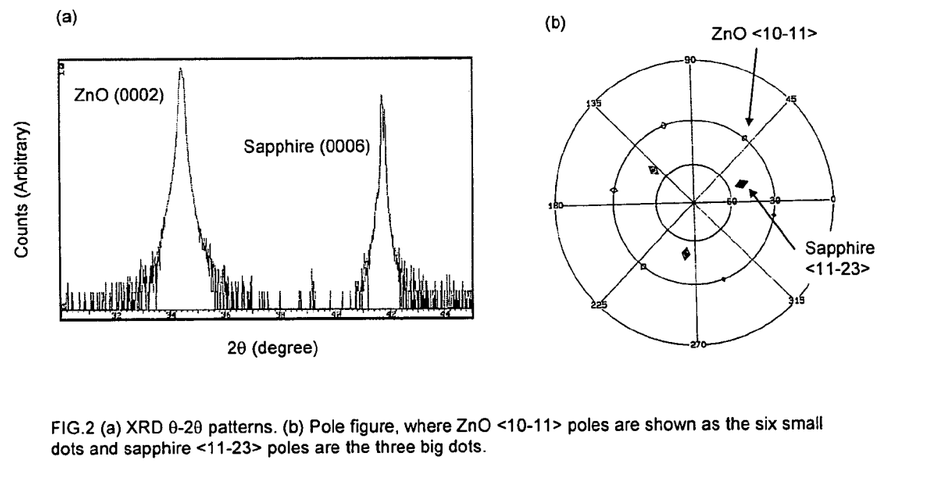
FIG. 2(a) shows X-ray $\theta$-$2\theta$ diffraction patterns of a P-Li-co-doped ZnO film deposited on a sapphire (0001) substrate.
FIG. 2(b) shows a pole figure measurement of the film.

FIG. 2($a$) shows the typical $\theta$-$2\theta$ XRD pattern of a Li-P-co-doped ZnO film deposited at 400° C. for the buffer layer and 450° C. for the doped layer on a sapphire (0001) substrate. The two peaks correspond to the basal planes of wurtzite structure ZnO and of the sapphire substrate. No diffractions from the other planes of ZnO or from impurity phases related to phosphorus and lithium are detected within the detection and resolution limit of the instrument. The full width at half maximum (FWHM) of the (0002) ZnO rocking curve is 0.8°. The epitaxial relationship between ZnO and the substrate is reviewed to be $[2\text{-}1\text{-}10]_{ZnO}//[10\text{-}10]_{sapphire}$ by pole figure measurements, as shown in FIG. 2($b$). This is also the less-strained epitaxial relationship compared to the one without the 30° rotation.

Figure 3:
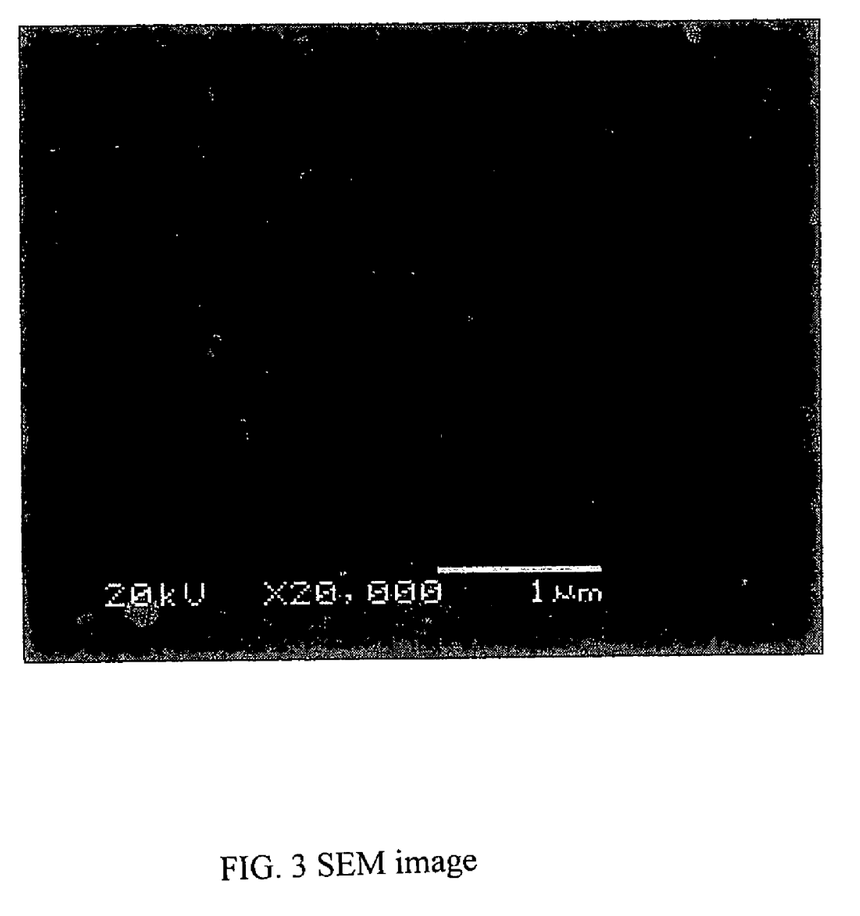
FIG. 3 is an SEM image of a P-Li-co-doped ZnO film surface.
Figure 4:
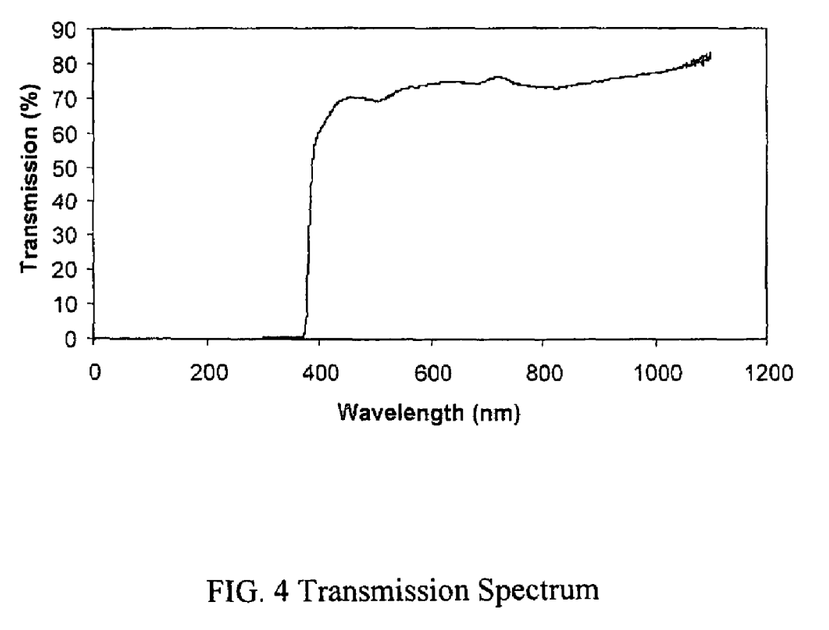
FIG. 4 shows the transmission spectrum of a P-Li-co-doped ZnO film.

The surface morphology of the above sample is shown in FIG. 3. The surface morphology suggests that the film is composed of small grains. The average grain size is measured to about 70 nm. FIG. 4 is an optical transmission spectrum of the sample. A clear cut-off edge at 370 nm indicates a band gap near 3.35 eV, and the high transmission in the visible to near infrared region indicates good optical properties.

Figure 5:
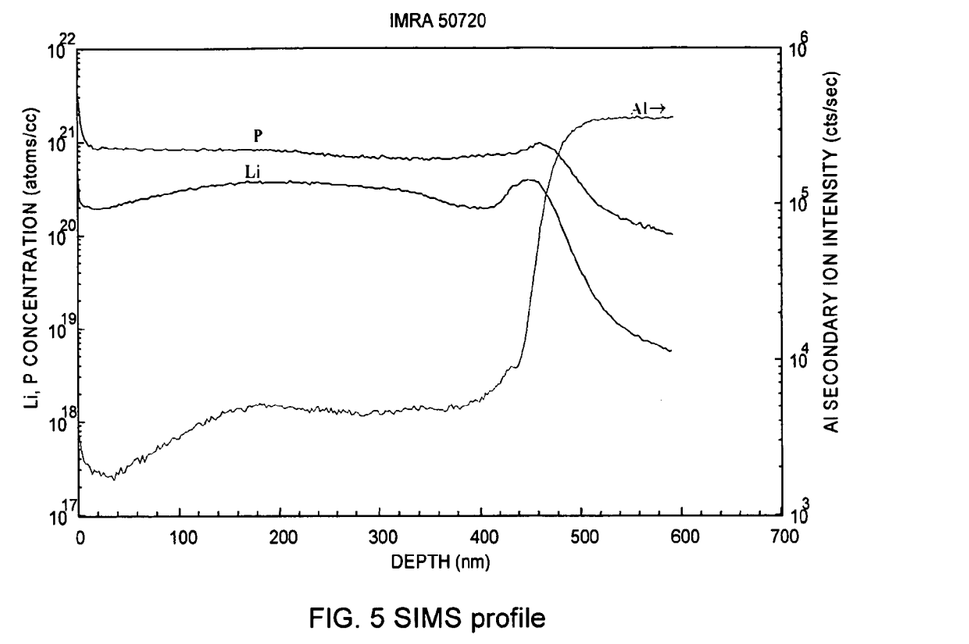
FIG. 5 shows SIMS depth profiles of P, Li, and Al in a P-Li-co-doped ZnO film grown on sapphire (0001).

FIG. 5 shows the SIMS (Secondary Ion Mass Spectroscopy) depth profile of Li, P and Al impurity in a ZnO film grown on sapphire. The target used for this sample has a nominal $Li_3PO_4$ concentration of 1%. It is observed that significant amounts of Li ($10^{20}$ cm$^{-3}$) and P ($10^{21}$ cm$^{-3}$) are present in the film, which are much higher than the typical dopant concentration in conventional semiconductors such as Si and GaAs. One reason is the high acceptor activation energy in ZnO, which gives a very low activation efficiency of less than 0.1%. Another reason is the high Al inter-diffusion from the substrate into the film, which is evident in the SIMS profile in FIG. 5. Al is an efficient donor for ZnO. Therefore, a large number of acceptors is needed to compensate the Al donor. Converting the Al signal to concentration, it was found the equivalent Al concentration averages $10^{18}$ cm$^{-3}$ in the film. Similarly, GaN substrates can have a similar interdiffusion problem, as Ga is also an efficient donor for ZnO. Therefore, by using other substrates such as MgO, SiC, Si, and insulating ZnO, the high concentration of Li and P is not required, and the weight percentage of lithium phosphate in the target can be lowered correspondingly down to 0.01%.

Table 1 lists the results of Hall measurements on a few Li-P-co-doped samples grown under different conditions, where the post-growth annealing treatments are all performed in a tube furnace in ambient conditions. The target is a mixture of ZnO with 1 wt % $Li_3PO_4$. The L-P-co-doped sample annealed at 600° C. and the as-grown sample (not shown in the table) are both weak n-type materials. After annealing at 700° C., the sample converts to p-type. Higher annealing temperatures (>900° C.) yield more resistive but still p-type materials.

Table 2 compares the results of Hall measurements on an un-doped ZnO and a P-doped ZnO grown under otherwise similar conditions. The target for the P-doped version is made of ZnO mixed with 1 wt % $P_2O_5$. It can be seen that P-ZNO remains a strong n-type material after different post-growth treatments. (As-grown P—ZnO is also of strong n-type.)

Thus it is seen that the co-doping technique of the invention results in stable p-type ZnO which cannot be otherwise obtained.

Figure 6:
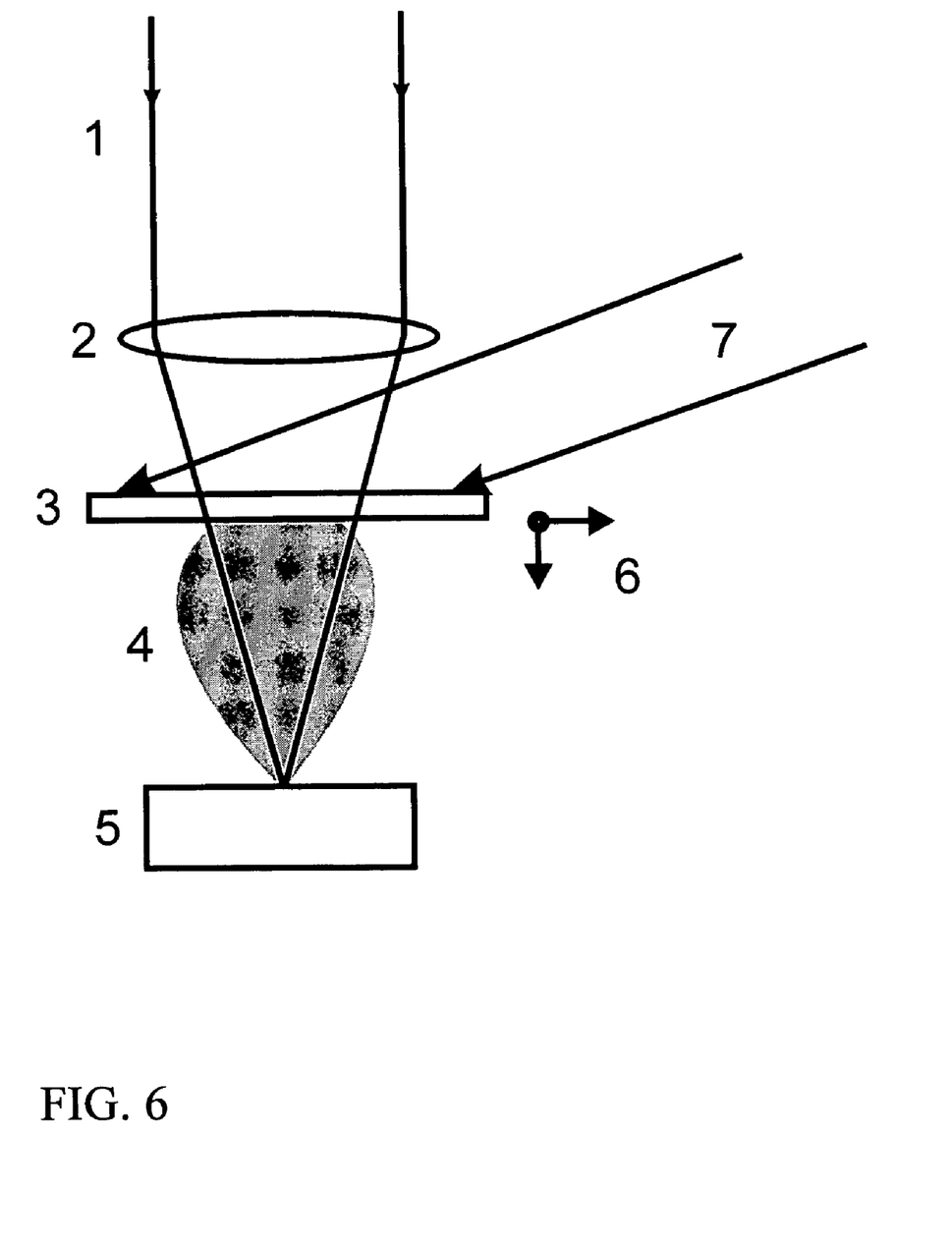
FIG. 6 schematically illustrates the setup for pulsed laser deposition of thin films where the pulsed laser 1 is guided through the back of the substrate 3. The substrate 3 can be translated by an x-y-z moving system 6. The heating of the substrate is achieved by irradiating the substrate with a CW infrared laser 7.

This invention also provides a method especially adapted for growing transparent thin films on transparent substrates. The setup is illustrated in FIG. 6. The substrate is positioned at a distance from the target. The pulsed laser is guided in such a way that it is incident from the back of the substrate, which is transparent, and then focuses on the target. Heating of the substrate, if necessary, can be provided by, for example, a CW infrared laser, e.g., a $CO_2$ laser (wavelength of 10.6 μm), which can be strongly absorbed by most dielectrics. The substrate can be laterally and vertically translated by an x-y-z translation system.

Because in this geometry, the substrate and the deposited material need to be transparent to the pulsed laser wavelength, this setup excludes opaque substrates and deposited materials. For the commonly used near infrared pulsed laser wavelengths e.g., 800 nm of Ti-Sapphire and 1 μm of Nd:YAG, most dielectrics are transparent and therefore can be used as the target material. These include, but are not limited to alumina ($Al_2O_3$), silica ($SiO_2$), metal oxides (MgO, ZnO, $TiO_2$, $ZrO_2$, $Nb_2O_5$,) including transparent conductive oxides (TCOs), such as In—Sn—O, F—Sn—O, Nb—Ti—O, Ga—Zn—O, Al—Zn—O, and p-type delafossite oxides $CuM(III)O_2$, (M(III)=Al, Ga, In), and wide gap III-V and II-VI semiconductors and their alloys (GaN, AlN, ZnS, ZnSe, ZnTe). The substrates can be transparent insulators such as, but not limited to, sapphire, quartz, glass, and transparent polymer substrates.

Because the substrate can be laterally translated in the x-y plane, this setup also provides a solution to scale up PLD for large area thin film deposition. By simply alternating targets of different materials, multilayers of thin films can also be grown.

Figure 7:
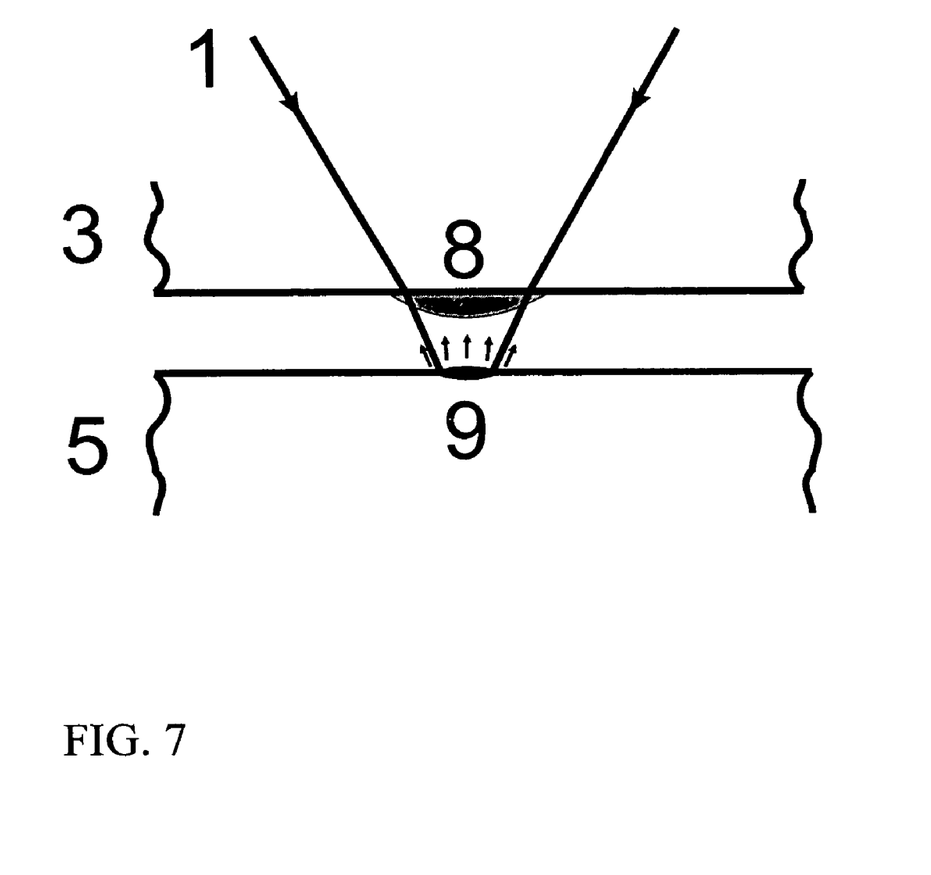
FIG. 7 depicts the geometry for depositing small size features by positioning the substrate close to the target such that the deposited features 8 can be of the similar size to the laser focal spot 9. Small arrows indicate the direction of the plume expansion.

FIG. 7 illustrates the situation when the substrate is positioned very close to the target. The purpose of bringing the substrate close to the target is to obtain small deposition features. A few issues need to be considered for this purpose.

The first important aspect is the shape of the ablation plume. In general, the angular distribution of the plume is described as $f(\theta)=\cos^n(\theta)$, where $\theta$ is the angle formed with the target surface normal, and n is a number depending on the ablation parameters. The angle at which the plume intensity is half of its maximum value is therefore expressed as $\theta_{1/2}=$ $\cos^{-1}(2^{-n})$. For nanosecond ablation, a wide range of the value of n has been reported varying from about 3 to above 20, depending on the pulse duration, pulse energy, wavelength, and the type of target material (i.e., transparent or opaque). Recently, it has been found that for the same target material and similar fluences, the plume of ultra-fast laser ablation is much narrower than that of nanosecond laser ablation. For example, for metal targets, a typical nanosecond laser ablation plume has a $\theta_{1/2}$ of about 33° (corresponding to n~4), while for picosecond and sub-picosecond laser ablation, the $\theta_{1/2}$ value is only 20° (corresponding to n~10). See R. Teghil et al., Picosecond and Femtosecond Pulsed Laser Ablation and Deposition of Quasiparticles, Applied Surface Science, Vol. 210 (2003), pp 307-317.

For oxides (e.g., ZnO), a comparison of the femtosecond and nanosecond laser ablation plume shapes also shows the very narrow angular distribution ($\theta_{1/2}$ less than 20°, judging from the CCD image), i.e., strong forward peaking of the femtosecond laser ablation plume. See J. Perriere et al., Comparison Between ZnO Films Grown by Femtosecond and Nanosecond Laser Ablation, Journal of Applied Physics, Vol. 91 (2002), pp 690-696.

Figure 8:
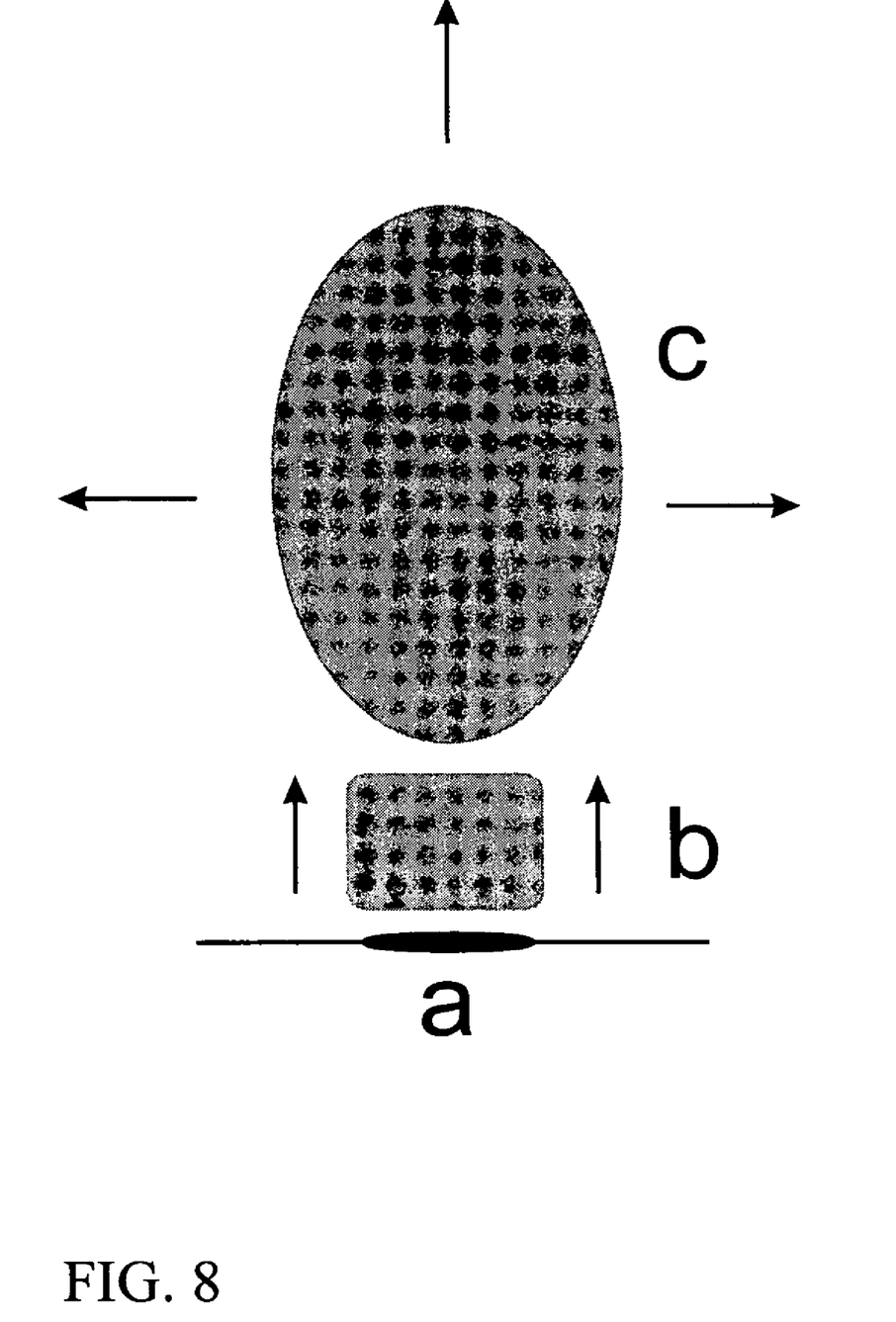
FIG. 8 schematically illustrates the time evolution of the shape of a laser ablation plume, where part (a) indicates the laser focal spot, which also contains the evaporation area; part (b) illustrates the one-dimensional (1D) transition stage (Knudsen layer); and part (c) illustrates the 3D adiabatic expansion stage. Arrows in the figure indicate the directions of plume expansion.

In addition to the above considerations, a careful examination of the early stages of the evolution of the laser ablation plume suggests further possibilities of reducing the deposition feature size at small substrate-target distances. In laser ablation, due to the boundary conditions imposed by the target surface, the evaporated gas experiences a pressure normal to the target surface, which results in a layer of gas (so-called Knudsen layer) expanding one-dimensionally along the surface normal. The adiabatic 3D expansion occurs after this layer of gas reaches thermal equilibrium through collision. These stages are schematically illustrated in FIG. 8 (adopted from J. C. S. Kools, E. van de Riet, and J. Dieleman, A Simple Formalism for the Prediction of Angular Distributions in Laser Ablation Deposition, Applied Surface Science, Vol. 69 (1993), pp 133-139). According to the Monte Carlo simulation reported in D. Sibold and H. M. Urbassek, Kinetic Study of Pulsed Desorption Flows into Vacuum, Physical Review A, Vol. 43 (1991), pp 6722-6734, at high ablation rates (>1 monolayer per pulse), the thickness of the Knudsen layer is about 20λ, where λ is the mean free path. Under typical nanosecond laser ablation conditions, this thickness is on the order of microns. By lowering the fluence and therefore lowering the ablation rates below 0.1 monolayer per pulse, the Knudsen layer can be thicker (due to reduced collisions), i.e., up to 100 µm. In addition, because ultra-fast laser ablation can generate faster atoms and ions than nanosecond laser ablation at similar fluences, this thickness can be larger in ultra-fast laser ablation due to the increased velocity of ablated atoms and ions. On the other hand, it is observed in experiments that under typical nanosecond laser ablation conditions, 3D expansion occurs after a relatively long time scale of 300 ns. See: Z. Zhang, P. A. VanRompay, J. A. Nees, and P. P. Pronko, Multi-diagnostic Comparison of Femtosecond and Nanosecond Pulsed Laser Plasmas, Journal of Applied Physics, Vol. 92 (2002), pp 2867-2874; and R. Gilgenbach and P. L. G. Ventzek, Dynamics of Excimer Laser-Ablated Aluminum Neutral Atom Plume Measured by Dye Laser Resonance Absorption Photography, Applied Physics Letters, Vol. 58 (1991), pp 1597-1599. Assuming a typical drift velocity of 500 m/s for the Knudsen layer, this time scale suggests a thickness of 150 µm.

Because the above-estimated thickness of the 1D expansion layer, on the order of 100 µm (preferably under low fluences) is a practically achievable substrate-target distance, we can utilize the narrow angular distribution of the ultra-fast laser ablation plume to achieve deposition of small patterns with sizes close to the laser focal spot by positioning the substrate very close to the target, as illustrated in FIG. 7. Note that the typical size of laser focal spot can be made very small (from a few microns to submicron diameter) by using beam expansion and a focusing lens of a large numerical aperture. Also note that the evaporation zone is actually contained within a smaller diameter than the laser focal spot in ultra-fast laser ablation (due to the limited heat diffusion). This deposition process can serve for direct writing of materials onto a substrate. In addition, by using high repetition rate (typically MHz) ultrafast lasers, a high deposition rate can also be achieved.

With the above-introduced capability of precise deposition of micron-scale features, two-dimensionally patterned structures such as arrays of dots and lines can be obtained simply by positioning the substrate close to the target and translating the substrate laterally. This process can thus serve as a means of direct writing of materials.

Figure 9:
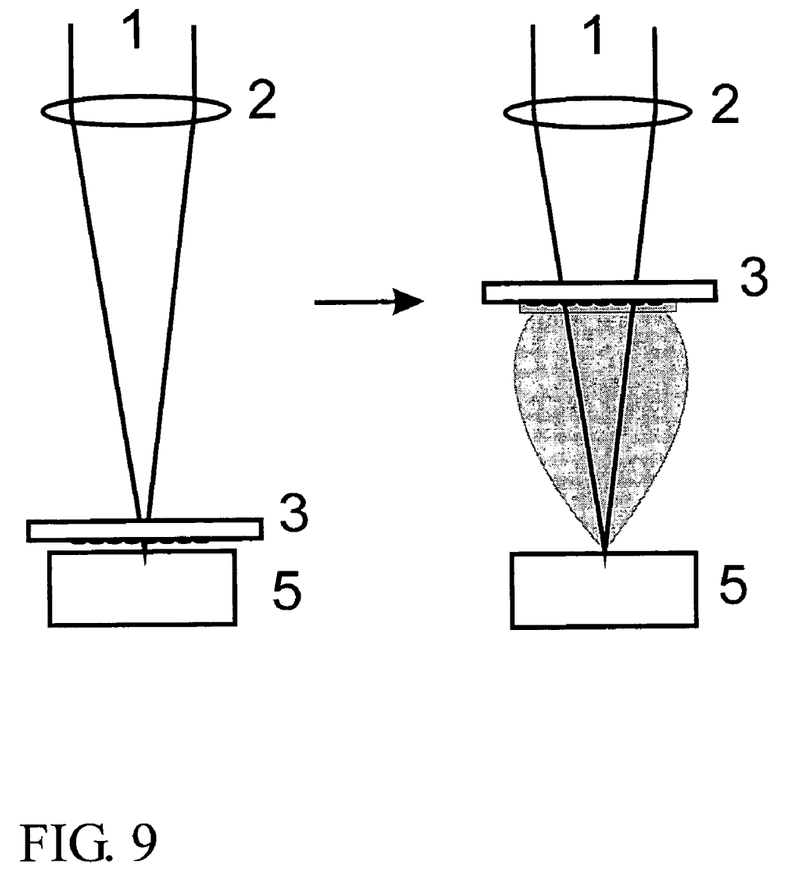
FIG. 9 schematically illustrates a deposition scheme in which the substrate is positioned near the target for depositing small size features and then moved away from the target to deposit intermediate layers. This process can be repeated to deposit multilayer structures.

A combination of the two growth processes at long and short target-substrate distances can provide a variety of designed growth patterns. For example, by alternating the two growth processes at long and short substrate-target distances with different target materials, respectively, lateral (in-plane) periodic structures can be obtained and then covered with intermediate layers of different materials, as illustrated in FIG. 9. This method would be suitable for fabrication of, for example, photonic devices such as dielectric mirrors, e.g., Bragg reflection mirrors and 2D and 3D PBG materials in the infrared and microwave regime.

Although several examples or embodiments have been described, the invention is not so limited, and is embodied in each novel feature and each combination of features, which particularly includes all combinations of the claimed features, even if this feature or this combination of features is not explicitly set forth in the claims or in the specification. In addition, this specification incorporates by reference all combinations set forth in the following claims.

TABLE 1

Electrical properties of Li—P-co-doped ZnO films made with a target of ZnO: Li$_3$PO$_4$ (1 wt %)

| Sample | Growth Temperature (° C.) | Anneal Temperature (° C.) | Anneal Time (min) | Resistivity (ohm cm) | Hall Mobility (cm$^2$/V) | Carrier Concentration (cm$^{-3}$) | Carrier Type |
|---|---|---|---|---|---|---|---|
| #5720 | 450 | 600 | 5 | 72 | 2 | $4 \times 10^{16}$ | n |
| #5720 | 450 | 700 | 3 | 40 | 1 | $1.5 \times 10^{17}$ | p |
| #5715 | 500 | 800 | 3 | 410 | 10 | $1.5 \times 10^{15}$ | p |
| #5711 | 500 | 800 | 11 | 1240 | 11 | $4 \times 10^{14}$ | p |

TABLE 2

Results of Hall measurements for an un-doped and a P-doped ZnO films

| Sample | Growth Temperature (°C.) | Anneal Temperature (°C.) | Anneal Time (min) | Resistivity (ohm cm) | Hall Mobility ($cm^2/V$) | Carrier Concentration ($cm^{-3}$) | Carrier Type |
|---|---|---|---|---|---|---|---|
| un-doped (#50623) | 500 | N/A | N/A | 0.4 | 22 | $8 \times 10^{17}$ | n |
| P-doped (#50726) | 450 | 700 | 3 | 0.5 | 2 | $6 \times 10^{18}$ | n |
| P-doped (#50726) | 450 | 800 | 3 | 0.2 | 6 | $5 \times 10^{18}$ | n |
| P-doped (#50726) | 450 | 900 | 3 | 0.09 | 18 | $4 \times 10^{18}$ | n |

The invention claimed is:

1. A method of depositing transparent thin films and direct deposition of patterned structures, comprising;
    providing a pulsed laser source, and focusing said laser on a target through a transparent substrate, so as to ablate or evaporate portions of said target using the energy of said laser;
    translating said substrate with respect to said target, such that when said substrate is positioned a first distance from said target, said ablated or evaporated target material forms a large area thin film on said substrate, and when said substrate is positioned a second distance which is smaller than the first distance from said target, said ablated or evaporated material forms patterned structures on said substrate.

2. The method of claim 1, wherein said patterned structures have surface features with a feature size as small as approximately a beam diameter of said laser.

3. The method of claim 1, wherein said large area thin film is grown while laterally translating the substrate.

4. The method of claim 1, further comprising growing a multilayer film on said substrate by alternatively using different target materials.

5. The method of claim 1, further comprising forming two-dimensionally patterned structures on said substrate by positioning the substrate at the second distance from the target and laterally translating the substrate.

6. The method of claim 1, further comprising forming a multilayer structure by alternating the growth processes at long and short target-substrate distances and using different target materials.

7. The method of claim 1, further comprising forming two-dimensionally patterned structures, comprising arrays of dots and/or lines, by directly writing onto the substrate by positioning the substrate at the second distance to the target and laterally translating the substrate.

8. The method of claim 1 wherein three-dimensionally patterned structures, comprising combinations of arrays of dots and/or lines, and thin film layers, are deposited by controlling the distance between substrate and target and laterally translating the substrate.

9. The method of claim 1, wherein said substrate comprises at least one of sapphire, SiC, quartz, fused silica, glass, and transparent polymer.

10. The method of claim 1 wherein said target comprises at least one of alumina ($Al_2O_3$), silica ($SiO_2$), metal oxides (MgO, ZnO, $TiO_2$, $ZrO_2$, $Nb_2O_5$), transparent conductive oxides (TCOs), wide gap III-V and II-VI semiconductors and their alloys (GaN, AlN, ZnS, ZnSe, ZnTe), and polymers.

* * * * *